United States Patent [19]
Kono

[11] Patent Number: 5,889,657
[45] Date of Patent: Mar. 30, 1999

[54] SURFACE-MOUNTING STRUCTURE AND METHOD OF ELECTRONIC DEVICES

[75] Inventor: Takashi Kono, Tokyo, Japan

[73] Assignee: NEC Corporation, Tokyo, Japan

[21] Appl. No.: 724,002

[22] Filed: Sep. 30, 1996

[30] Foreign Application Priority Data

Sep. 28, 1995 [JP] Japan ................................ 7-250625

[51] Int. Cl.⁶ ................................................. H01R 9/00
[52] U.S. Cl. ........................... 361/773; 361/774; 361/767; 361/771; 257/692; 257/739; 257/773; 438/665; 438/666; 29/842
[58] Field of Search ..................................... 361/772, 773, 361/774, 767, 768, 771, 782, 783; 439/83, 84; 438/612, 613, 665, 666; 257/737, 739, 773, 785, 692, 693, 696; 29/837, 838, 845, 842

[56] References Cited

U.S. PATENT DOCUMENTS

| | | | |
|---|---|---|---|
| 4,339,870 | 7/1982 | Ball et al. ................................ | 257/773 |
| 5,279,711 | 1/1994 | Frankeny et al. ....................... | 361/774 |
| 5,299,939 | 4/1994 | Walker et al. ............................ | 439/74 |
| 5,345,365 | 9/1994 | Herndon et al. ......................... | 361/772 |
| 5,360,946 | 11/1994 | Feger et al. ............................. | 174/261 |
| 5,469,615 | 11/1995 | Yamazaki ................................. | 29/846 |
| 5,519,251 | 5/1996 | Sato et al. ................................ | 257/666 |
| 5,578,526 | 11/1996 | Akram et al. ............................ | 438/107 |

FOREIGN PATENT DOCUMENTS 60-176588 11/1985 Japan .
4-55149 5/1992 Japan .

OTHER PUBLICATIONS

Microelectronics Packaging Handbook, ed. R.R. Tummala and E.J. Rymaszewski,pp. 369–374, Dec. 1989.

*Primary Examiner*—Leo P. Picard
*Assistant Examiner*—John B. Vigushin
*Attorney, Agent, or Firm*—Young & Thompson

[57] ABSTRACT

A surface-mounting structure of a surface-mounting electronic device onto the surface of a circuit medium is provided. An external terminal of the device has a first mounting surface on which a first set of protrusions are formed. The first mounting surface includes a first uncovered space in the remaining area of the first set of protrusions. A mounting pad of the circuit medium has a second mounting surface on which a second set of protrusions are formed. The second mounting surface includes a second uncovered space in the remaining area of the second set of protrusions. The second mounting surface is opposite to the first mounting surface. The second set of protrusions are inserted into the first uncovered space. The first set of protrusions are inserted into the second uncovered space. A bonding material is placed between the first and second mounting surfaces. The bonding material provides a mechanical engagement between the first and second mounting surfaces, thereby mechanically and electrically connecting the terminal of the device onto the mounting pad of the circuit medium. The mounting process and its process control are simplified, and connection accuracy and reliability are improved.

11 Claims, 10 Drawing Sheets

SURFACE-MOUNTING STRUCTURE AND METHOD OF ELECTRONIC DEVICES

BACKGROUND OF THE INVENTION

1. Field of the Invention

The present invention relates to a surface-mounting technique of electronic devices and more particularly, to a surface-mounting structure and method of electronic devices such as resistors, capacitors, diodes, transistors, integrated circuit devices (ICs) and the like onto the surface of a circuit medium such as a printed circuit board, a ceramic substrate and the like.

2. Description of the Prior Art

Conventionally, on mounting operation of a surface-mounting electronic device onto the surface of a printed circuit board, a well-known soldering technique as shown in FIG. 1 has been developed and practically used in a variety of application fields.

As shown in FIG. 1, first, a solder paste 115 is coated on a mounting pad 112 which is formed on the surface of a circuit board 111. Next, a terminal 114 of a surface-mounting electronic device 113 is placed onto the coated solder paste 115. Then, the solder paste 115 is temporarily melted by the application of heat and then cooled, thereby connecting the terminal 114 to the pad 112 by the solder joint 115.

Also, a mounting technique for a printed circuit board using face fasteners was disclosed in the Non-Examined Utility-Model Publication Nos. 60-176588 and 4-55149.

FIG. 2 shows a method of easily bonding a couple of faces by face fasteners, which was disclosed in the Non-Examined Utility-Model Publication No. 60-176588.

In FIG. 2, a face fastener 222 is stuck onto a flat bent-up part formed by cutting and raising a chassis 221. Another face fastener 224 is stuck onto the bottom side of a printed circuit board 223. Electronic parts 225 are mounted on the top side of the board 223. The exposed hooks of the two face fasteners 222 and 224 are mutually joined or linked by pressing them. Thus, the printed circuit board 223 is fixed to the flat bent-up part of the chassis 221.

FIG. 3 shows another method of easily bonding a couple of faces by face fasteners, which was disclosed in the Non-Examined Utility-Model Publication No. 4-55149.

In FIG. 3, curled members 332 made of a thermally conductive material are fixed thickly on a surface of a heat-radiation plate 331, thereby forming a face fastener. Curled members 334 made of a thermally conductive material are fixed thickly on a surface of a heat-radiation plate 333, thereby forming another face fastener. These two face fasteners are forced to adhere to each other while applying a thermally conductive grease 335, interlocking and connecting the plates 331 and 333.

In the above conventional face fastener techniques, which should naturally be capable of freely attaching and detaching the fasteners, the face fasteners are connected by mutually locking the curled or hooked members under the application of pressure. The connected fasteners are disconnected by causing elastic deformation in the curled or hooked members with a tensile force to thereby release their mutual locking.

The above conventional mounting structures have the following problems.

With the above conventional bonding method using the solder paste shown in FIG. 1, a process of applying the solder paste onto the mounting pads is necessary before placing the surface-mounting devices on the circuit board. Furthermore, the solder paste has many factors to adversely affect the workmanship of the surface-mounting structure. For example, placement error of the devices, and tombstone (Manhattan) phenomenon where the devices undesirably rise due to uneven melting of the solder paste on heating or the like readily take place. This makes the surface-mounting process complex, thereby not only complicating the process control but also giving rise to problems with connection accuracy and reliability.

On the other hand, if the above fastener technique is applied to the connection between a terminal of an electronic device and a mounting pad of a circuit board, the formation of fine curled, hooked, or barbed members of an electrically conductive material is necessary on the metal faces of the terminal and pad. As electrically conductive materials, a variety of metals, electrically conductive plastics, and resins mixed with an electrically conductive filler have been well known. However, whichever the electrically conductive material may be used, it is technically quite difficult to form a curled, hooked, or barbed shape on the metal face, thus raising a problem of unsuitability to industrial applications.

Furthermore, the curled, hooked, or barbed members used in the above conventional fastener technique facilitate the face-to-face connection and disconnection through their forced elastic deformation. Thus, another problem that the necessity of appropriate elastic deformation limits the material selection range.

SUMMARY OF THE INVENTION

Accordingly, an object of the present invention is to provide a surface-mounting structure and a method of a surface-mounting electronic device onto the surface of a circuit medium in which a mounting process and its process control are simplified, connection accuracy and reliability are improved, and materials for connection may be more easily selected.

According to a first aspect of the present invention, a surface-mounting structure is provided, which includes a surface-mounting electronic device having a terminal, and a circuit medium having a mounting pad on its surface.

The external terminal has a first mounting surface on which a first set of protrusions are formed. The first mounting surface includes a first uncovered space in the remaining area of the first set of protrusions.

The mounting pad has a second mounting surface on which a second set of protrusions are formed. The second mounting surface includes a second uncovered space in the remaining area of the second set of protrusions. The second mounting surface is opposite to the first mounting surface. The second set of protrusions are inserted into the first uncovered space. The first set of protrusions are inserted into the second uncovered space.

A bonding material is placed between the first mounting surface and the second mounting surface. The bonding material provides a mechanical engagement between the first and second mounting surfaces, thereby mechanically and electrically connecting the terminal of the device onto the mounting pad of the circuit medium.

With the surface-mounting structure according to the first aspect of the present invention, the first set of protrusions are formed on the first mounting surface of the external terminal of the surface-mounting electronic device, and the second set of protrusions are formed on the second mounting surface of the mounting pad of the circuit medium. The second set of protrusions are inserted into the opposing first uncovered space, and the first set of protrusions are inserted into the opposing second uncovered space.

Further, the bonding material is placed between the first and second mounting surfaces and provides a mechanical engagement between the first and second mounting surfaces, thereby mechanically and electrically connecting the terminal of the device onto the mounting pad of the circuit medium.

Thus, the soldering technique is not necessarily used and therefore, the mounting process and its process control are simplified and at the same time, the connection accuracy and reliability are improved.

Also, since the fastener technique also is not used, materials for connection is selected more easily.

For the terminal and the mounting pad, any electrically conductive material may be used if it can be used for a terminal of an electronic device or a mounting pad of a circuit medium and it can have the above first or second set of protrusions.

As the bonding metal, any electrically conductive material may be used if it is capable of mechanical and electrical connection of the terminal with the mounting pad by a surface-mounting operation.

In a preferred embodiment of the structure according to the first aspect, the bonding material is placed between the tops of the first set of protrusions and the opposing bottom of the second uncovered space and between the tops of the second set of protrusions and the opposing bottom of the first uncovered space.

The connection or bonding strength is further improved.

The bonding material may be placed either between the tops of the first set of protrusions and the opposing bottom of the second uncovered space or between the tops of the second set of protrusions and the opposing bottom of the first uncovered space.

The number of the mounting process steps is further reduced compared with the case where the bonding material is placed both between the tops of the first set of protrusions and the opposing bottom of the second uncovered space and between the tops of the second set of protrusions and the opposing bottom of the first uncovered space.

In another preferred embodiment of the structure according to the first aspect, the bonding material is made or a metal having a melting point of 450° C. or less, for example, a solder and Sn.

The bonding material can be melted by the application of heat without degrading the performance of the device.

In this case, it is preferred that the bonding material is in a resolidified state and is bonded to the tops of the first set of protrusions and the opposing bottom of the second uncovered space and/or to the tops the second set of protrusions and the opposing bottom of the first uncovered space.

This resolidified metal enhances the bonding strength between the first and second mounting surfaces.

The external terminal of the device and the mounting pad of the circuit medium may be made of any electrically conductive material as necessary.

According to a second aspect of the present invention, a surface-mounting method is provided, which includes the following steps (a) to (d):

(a) A surface-mounting electronic device having an external terminal is prepared. The external terminal has a first mounting surface on which a first set of protrusions are formed. The first mounting surface includes a first uncovered space in the remaining area of the first set of protrusions.

(b) A circuit medium having a mounting pad on its surface is prepared. The mounting pad has a second mounting surface on which a second set of protrusions are formed. The second mounting surface includes a second uncovered space in the remaining area of the second set of protrusions.

(c) Pieces of a bonding material are formed onto the respective tops of at least one of the first set of protrusions and the second set of protrusions.

(d) The first set of protrusions and the second set of protrusions are inserted into the second uncovered space and the first uncovered space under pressure, respectively, while the first mounting surface and the second mounting surface are opposite to each other.

The pieces of the bonding material provide a mechanical engagement between the first mounting surface and the second mounting surface, thereby mechanically and electrically connecting the terminal of the device onto the mounting pad of the circuit medium.

With the surface-mounting method according to the second aspect, the surface-mounting structure according to the first aspect can be realized.

In a preferred embodiment of the method according to the second aspect, a step (e) of heating the pieces of the bonding material during a specific time after the step (d) is further provided to temporarily melt the pieces.

Since the pieces of the bonding material are resolidified to thereby bond the tops of at least one of the first and second sets of protrusions to a corresponding one of the bottoms of the first and second uncovered spaces through the step (e), an additional advantage of the increased bonding strength can be obtained.

The pieces of the bonding material are preferably formed by a plating process in said step (c).

Each of the first and second sets of protrusions is preferably formed by an etching process. However, it maybe formed by a machining process.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1:
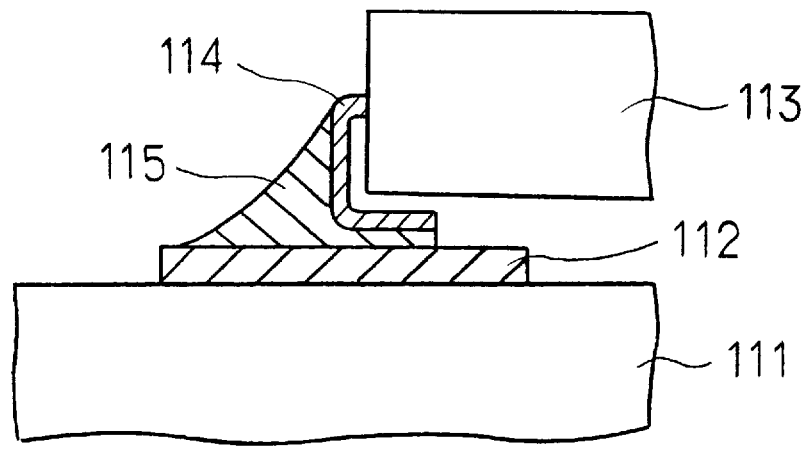
FIG. 1 is a cross-sectional view of a conventional surface-mounting structure of an electronic device, in which the soldering technique is used.
Figure 2:
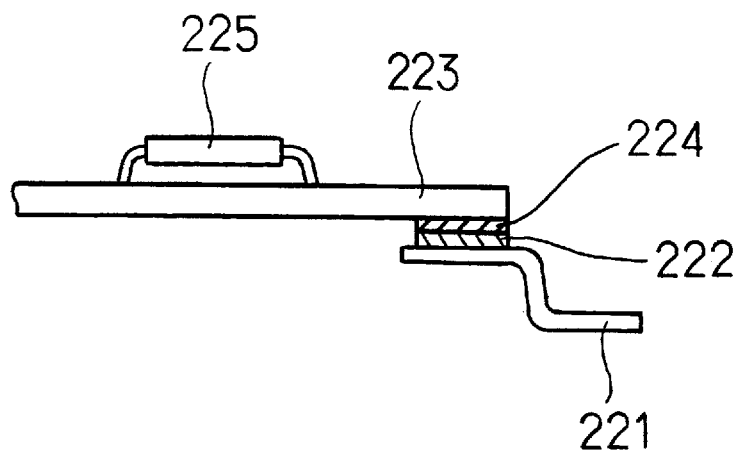
FIG. 2 is a cross-sectional view of another conventional surface-mounting structure of an electronic device, in which the fastener technique is used.
Figure 3:
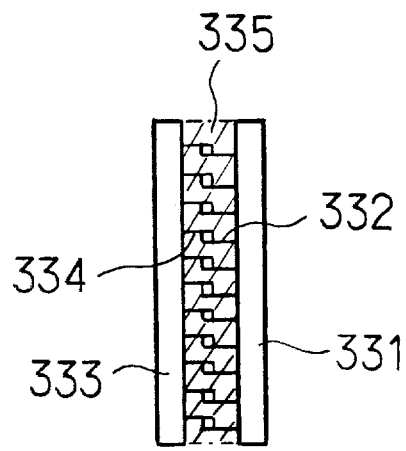
FIG. 3 is a cross-sectional view of still another conventional surface-mounting structure of an electronic device, in which the fastener technique is used.

Preferred embodiments of the present invention will be described below by referring to the drawings attached.

FIRST EMBODIMENT

FIGS. 4 to 9 show a surface-mounting structure of an electronic device according to a first embodiment of the invention.

Figure 4:
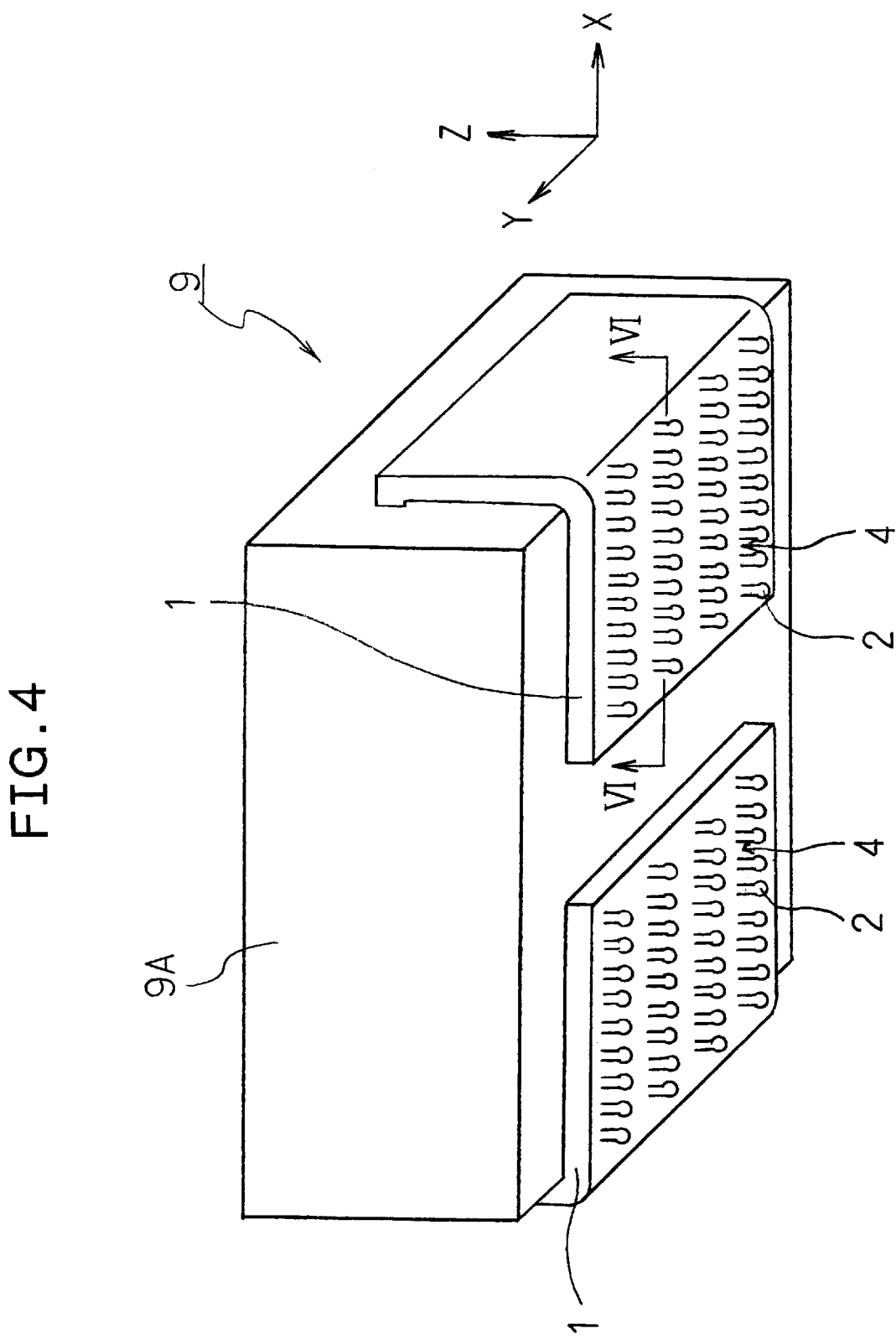
FIG. 4 is a perspective view of a surface-mounting device used for a surface-mounting structure according to a first embodiment of the invention.

As shown in FIG. 4, a surface-mounting electronic device 9 has a body 9a with an approximately parallelepiped shape and a pair of metallic external terminals 1 with an L-shape. The terminals 1 are bent along the bottom and side surfaces of the body 9a, and fixed thereon, respectively.

A large number of fine cylindrical protrusions 2 are formed on the mounting surfaces of the terminals 1, respectively. The protrusions 2 are arranged at regular intervals in the directions of X and Y into a matrix. The longitudinal axis of the protrusions 2 extends perpendicular to the bottom faces of the terminals 1 (i.e., along the direction Z).

Uncovered spaces 4 are formed in the remaining areas of the protrusions 2 on the mounting surfaces, respectively.

The protrusions 2 are produced by an etching process of the mounting surfaces of the terminals 1.

Figure 5:
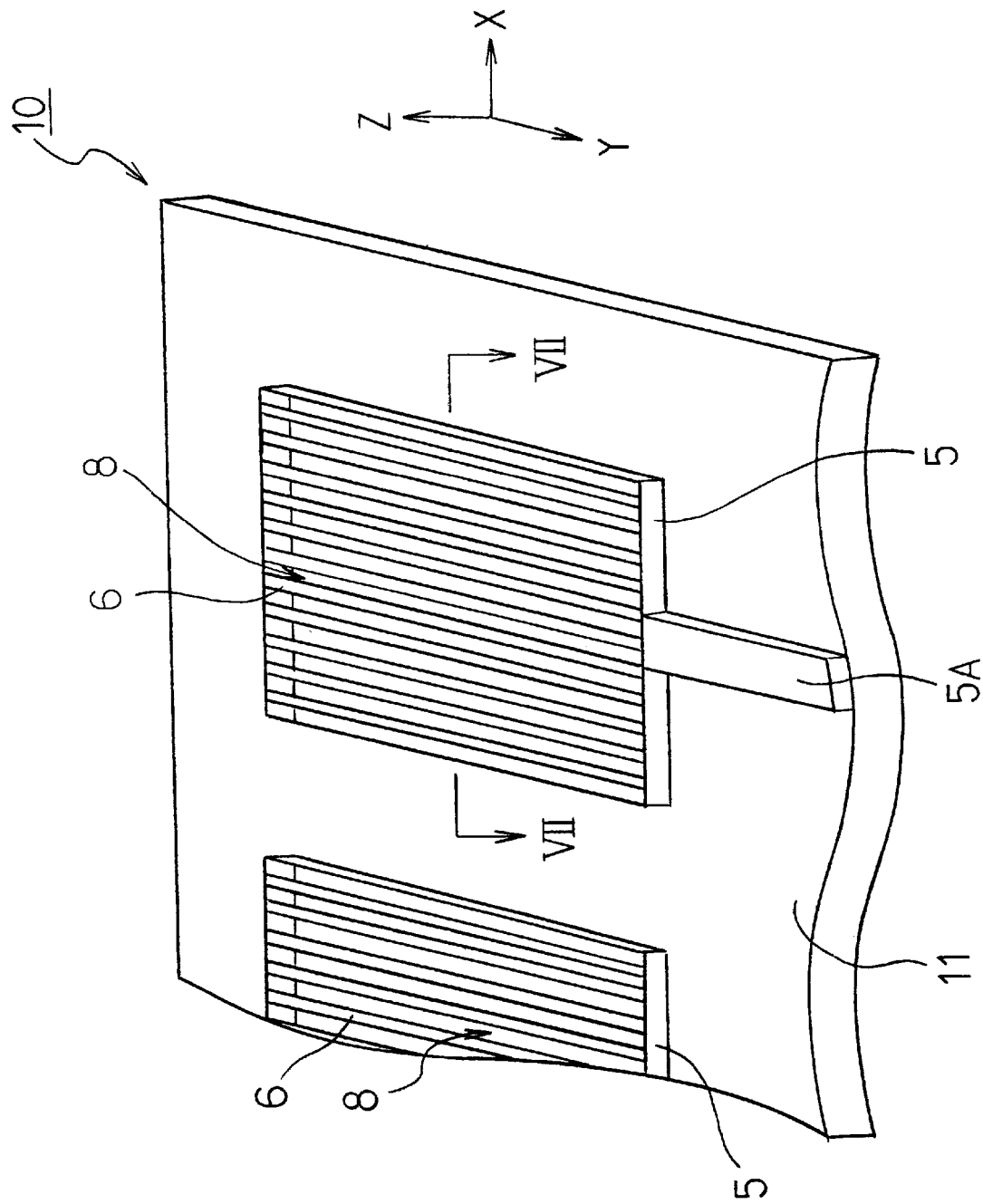
FIG. 5 is a partial perspective view of a printed circuit board used for the surface-mounting structure according to the first embodiment of the invention.

On the other hand, as shown in FIG. 5, two patterned metallic mounting pads or lands 5 and two patterned metallic interconnections 5A connected to the respective pads 5 are formed on an insulating layer 11 of a printed circuit board 10. The shape, location and size of the two pads 5 are so designed that the pair of terminals 1 of the device 9 are placed on the corresponding pads 5 so as to be overlapped therewith, respectively.

A plurality of protrusions 6 having a rectangular cross section are formed in parallel on the mounting surfaces of the mounting pads 5. The protrusions 6 extend as stripes in the direction Y and are arranged in the direction of X at a regular interval. The transverse axis of the protrusions 6 is perpendicular to the mounting surfaces of the pads 5.

Uncovered spaces 8 are formed between adjacent two ones of the protrusions 6 on the mounting surfaces of the pads 5, respectively. The spaces 8 are located in parallel to extend in the direction Y.

When the device 9 is surface-mounted on the circuit board 10, each row of the dot-like protrusions 2 of the terminals 1, which extends in the direction of Y, can be inserted into a corresponding one of the stripe-like uncovered spaces a of the pads 5. At the same time, each of the stripe-like protrusions 6 of the pads 5 can be inserted into a corresponding linear area of the uncovered spaces 4, which extends in the direction Y.

Figure 6:
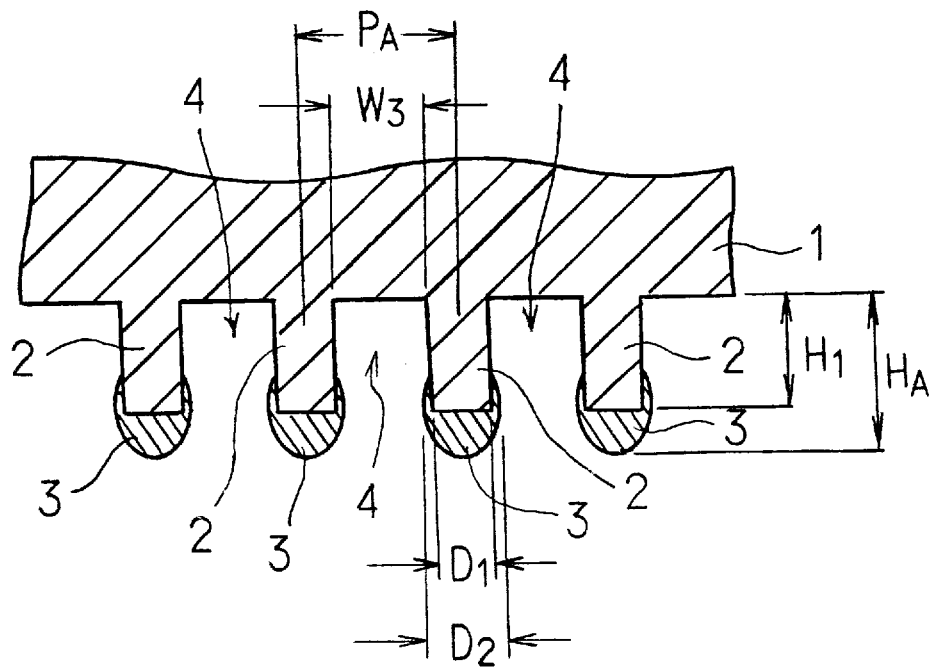
FIG. 6 is a schematic, partial cross-sectional view of the terminal of the surface-mounting device shown in FIG. 4.

FIG. 6 is an enlarged, partial cross-sectional view along the line VI—VI in FIG. 4, which specifically shows the protrusions 2 of the terminal 1 of the device 9.

As shown in FIG. 6, to improve or reinforce the bonding strength, pieces 3 of a metallic bonding material are fixed onto the tops of the protrusions 2, respectively. The bonding material used is a solder containing tin (Sn) and lead (Pb). The composition of this solder is 90% of tin and 10% of lead in weight, i.e., Sn:Pb=9:1. The pieces 3 are approximately hemispherical.

The size or diameter $D_2$ of the solder piece 3 is larger than the diameter $D_1$ of the protrusion 2. The diameter $D_1$ is approximately 30 $\mu$m and the diameter $D_2$ is approximately 40 $\mu$m.

The overall height $H_A$ of the protrusion 2 and the solder piece 3 on the terminal 1, which is defined as the distance from the bottom of the uncovered space 4 to the top of the solder pieces 3, is approximately 70 $\mu$m.

The height $H_1$ of the protrusion 2 on the terminal 1, which is defined as the distance from the bottom of the uncovered space 4 to the top of the protrusion 2, is approximately 50 $\mu$m.

The distance or pitch $P_A$ between the centers of the adjacent protrusions 2 is approximately 100 $\mu$m. In other words, the protrusions 2 are arranged at the pitch $P_A$ of approximately 100 $\mu$m in the X and Y directions.

The width $W_3$ of a part of the uncovered space 4 between the adjacent protrusions 2 is approximately 70 $\mu$m, because $W_3 = P_A - D_1 = 100 \ \mu m - 30 \ \mu m = 70 \ \mu m$.

Nickel silver, copper, iron, nickel, and their alloys are preferably available for the terminals 1, i.e., protrusions 2. In this embodiment, nickel silver (i.e., German silver or Cu—Zn—Ni alloy) is used in view of good wettability for the solder.

Figure 7:
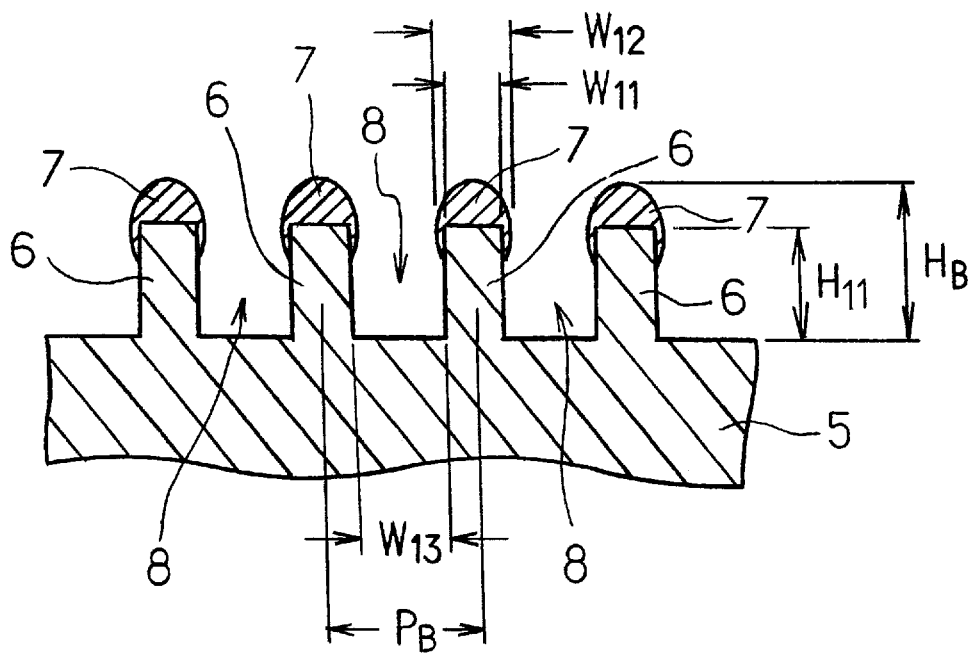
FIG. 7 is a schematic, partial cross-sectional view of the mounting pad of the circuit board shown in FIG. 5.

FIG. 7 is an enlarged, partial cross-sectional view along the line VII—VII in FIG. 5, which specifically shows the protrusions 6 of the mounting pad 5 of the circuit board 10.

As shown in FIG. 7, to further improve or reinforce the bonding strength, pieces 7 of a metallic bonding material are fixed onto the tops of the protrusions 6, respectively. Here, the bonding material of the pieces 7 is the same Sn—Pb solder as that of the pieces 2. The pieces 7 have a rod-like shape extending along the protrusions 6 and a cross section of approximately the same hemispherical shape.

The size or width $W_{12}$ of the solder piece 7 is larger than the width $W_{11}$ of the protrusion 6. The width $W_{11}$ is approximately 30 $\mu$m and the width $W_{12}$ is approximately 40 $\mu$m.

The overall height $H_9$ of the protrusion 6 and the solder piece 7 on the pad 5, which is defined as the distance from the bottom of the uncovered space 8 to the top of the solder pieces 7, is approximately 70 $\mu$m.

The height $H_{11}$ of the protrusion 6 on the pad 5, which is defined as the distance from the bottom of the uncovered space 8 to the top of the protrusion 6, is approximately 50 $\mu$m.

The distance or pitch $P_B$ between the centers of the adjacent protrusions 6 is approximately 100 $\mu$m. In other words, the protrusions 6 are arranged at the pitch $P_B$ of approximately 100 $\mu$m in the X and Y directions.

The width $W_{13}$ of a part of the uncovered space 8 between the adjacent protrusions 6 is approximately 70 $\mu$m, because $W_{13}=P_B-W_{13}=100$ $\mu$m$-30$ $\mu$m$=70$ $\mu$m.

The pads 5 are made of copper-iron alloy or a solder.

The pitches $P_A$ and $P_B$ of the protrusions 2 and 6 are preferably set as a value between 1 $\mu$m and 0.5 mm. If they are set as a value outside this range, desired bonding strength and electrical characteristics are difficult to obtain.

The width $W_3$ of the part of the space 4 is preferably set as a value between 105% and 200% of the width $W_{12}$ of the solder piece 7. The width $W_{13}$ of the part of the space 8 is preferably set as a value between 105% and 200% of the diameter $D_2$ of the solder piece 3. If these dimensional relationships are not satisfied, desired bonding strength and electrical characteristics are difficult to obtain.

When the solder pieces 3 and 7 are not used, the width $W_3$ of the part of the space 4 is preferably set as a value between 105% and 200% of the width $W_{11}$ of the protrusion 6. The width $W_{13}$ of the part of the space 8 is preferably set as a value between 105% and 200% of the diameter $D_1$ of the protrusion 2. If these dimensional relationships are not satisfied, desired bonding strength and electrical characteristics are difficult to obtain.

The device 9 is surface-mounted on the circuit board 10 in the following way:

First, the position of the device 9 is adjusted so that the mounting surfaces of the external terminals 1 are opposite to the mounting surfaces of the mounting pads 5.

Figure 8:
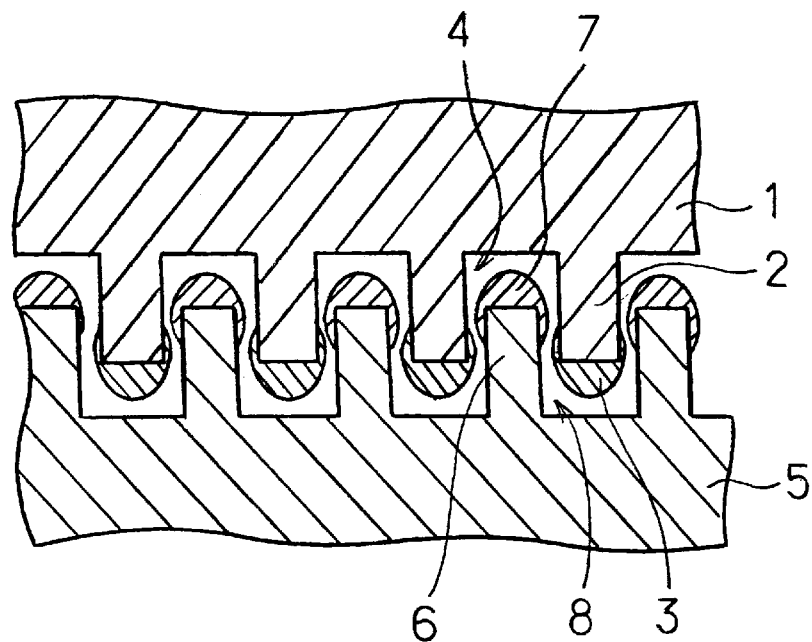
FIG. 8 is a schematic, partial cross-sectional view of the surface-mounting structure according to the first embodiment of the invention, in which the terminal and pad are on the way of the insertion process.

Then, as shown in FIG. 8, the protrusions 2 of the terminal 1 are inserted into the opposing parts of the uncovered spaces 8 of the pad 5 under pressure, respectively.

Figure 9:
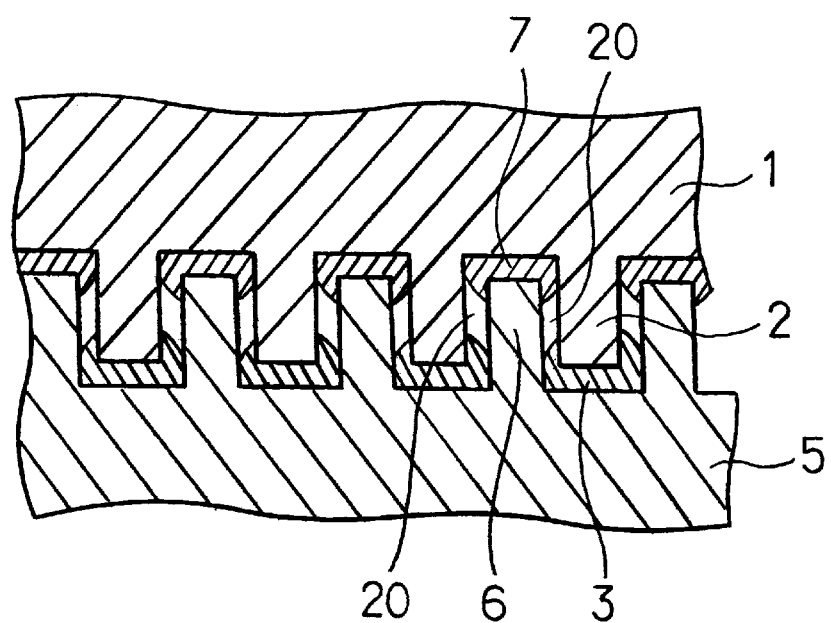
FIG. 9 is a schematic, partial cross-sectional view of a surface-mounting structure according to the first embodiment of the invention, in which the insertion process of the terminal and pad is finished.

Finally, as shown in FIG. 9, the solder pieces 3 of the terminal 1 are contacted with the bottoms of the opposing parts of the spaces 6 to thereby be collapsed by the pressure. At the same time, the solder pieces 7 of the pad 5 are contacted with the bottoms of the opposing parts of the spaces 4 to thereby be collapsed by the pressure.

Thus, the collapsed solder pieces 3 and 7 provide a mechanical engagement between the mounting surfaces of the terminals 1 and mounting pad 5, thereby mechanically and electrically connecting the terminals 1 of the device 9 onto the mounting pad 5 of the circuit board 10.

In this connected or interlocked state in FIG. 9, each of the stripe-like protrusions 6 of the mounting pad 51 which are arranged vertically to the paper, is located within the corresponding parts of the uncovered space 4 of the terminal 1 which are arranged the same direction.

Small gaps 20 exist between the opposing mounting surfaces of the terminals 1 and mounting pads 5, as shown in FIG. 9.

Additionally, the pitches and sizes of the respective protrusions 2 and 6 usually contain some fluctuation due to errors caused during fabrication processes. Therefore, some of the protrusions 2 and 6 tend to deform due to this fluctuation at the time of mounting or connection, thereby generating a mechanical engagement of the terminal 1 and pad 5.

The terminals 1 of the device 9 and the mounting pads 5 of the circuit board 10 may be made by the conventional popular ways.

The protrusions 2 and 6 can be formed by one of popular selective etching processes that has been used in the semiconductor industry. For example, a dry or wet chemical etching processes using a masking film can be used.

If the dimension of the protrusions 2 and 6 is in the order of several hundreds $\mu$m, any machining process such as cutting can be used therefor.

A preferable method available to the process of forming the pieces 3 of the bonding material is as follows:

The protrusions 2 and 6 are formed and then, an appropriate amount of the bonding material such as solder is deposited onto the tops of the protrusions 2 and 6 by an electrochemical process.

For example, an electroless plating process is suitable for this purpose. Advantageously, with electroless plating, the reason is that when a voltage is applied to the terminals 1 and pads 5 in the electroplating solution, the electric field concentration occurs at the protrusions 2 and 6, allowing more metal to deposit at the tops of the protrusions 2 and 6. This means that a desired shape of the bonding material pieces 3 can be readily obtained.

With the surface-mounting structure according to the first embodiment, the protrusions 2 are formed on the mounting surfaces of the external terminals 1 of the surface-mounting electronic device 9, and the protrusions 6 are formed on the mounting surfaces of the mounting pads 5 of the circuit board 10. The protrusions 2 are inserted into the opposing uncovered space 8, and the protrusions 6 are inserted into the opposing uncovered space 4.

Further, the pieces 3 and 7 of the bonding material are placed between the mounting surfaces of the device 9 and board 10 and provides a mechanical engagement between the two mounting surfaces, thereby mechanically and electrically connecting the terminals 1 onto the mounting pads 5.

Thus, the soldering technique is not necessarily used and therefore, the mounting process and its process control are simplified and at the same time, the connection accuracy and reliability are improved. No placement errors of the devices 9 nor the Manhattan phenomenon occurs during the soldering process.

Also, since the conventional fastener technique is not used, materials for connection are selected more easily.

SECOND EMBODIMENT

Figure 10:
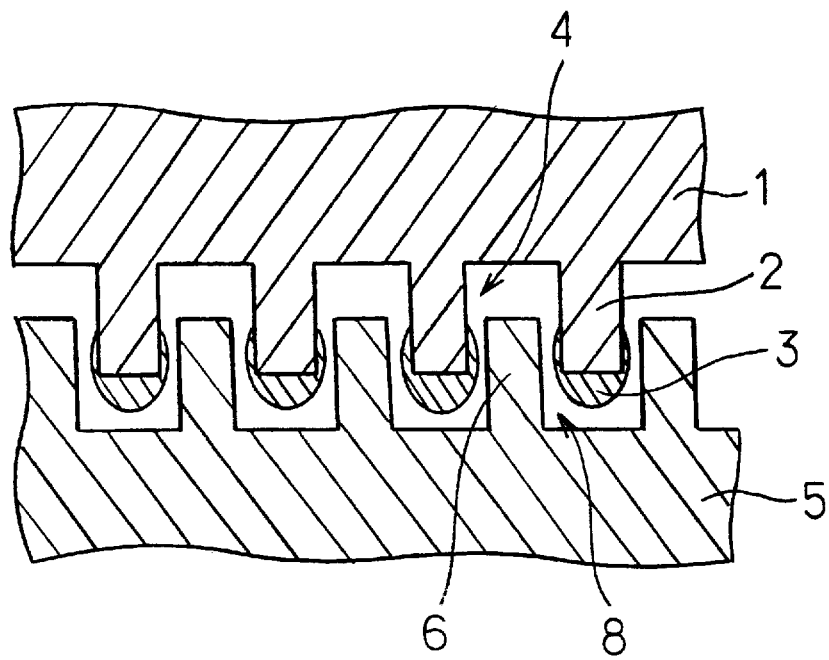
FIG. 10 is a schematic, partial cross-sectional view of a surface-mounting structure according to a second embodiment of the invention, in which the terminal and pad are on the way of the insertion process.
Figure 11:
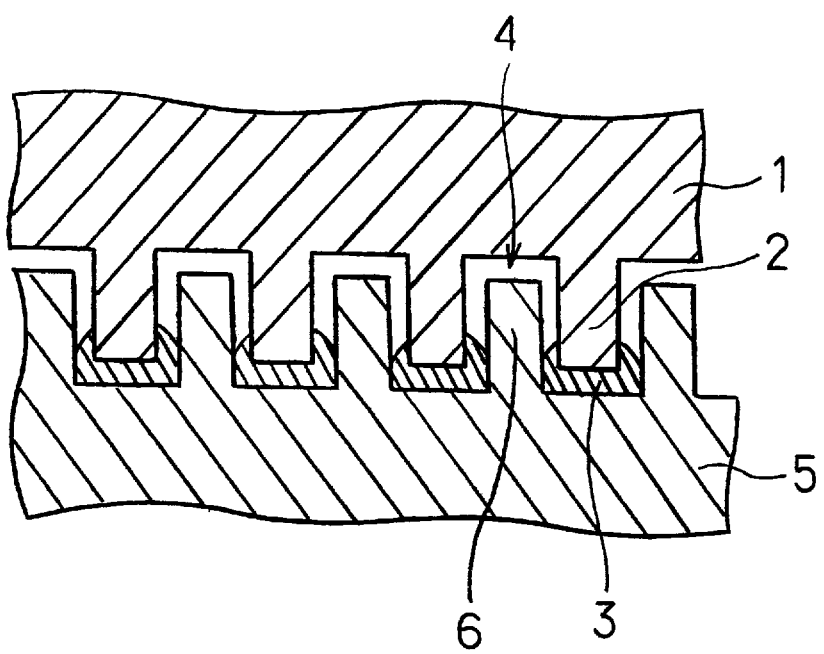
FIG. 11 is a schematic, partial cross-sectional view of a surface-mounting structure according to the second embodiment of the invention, in which the insertion process of the terminal and pad is finished.

FIGS. 10 and 11 show a surface-mounting structure of an electronic device according to a second embodiment of the invention.

The second embodiment has the same structure and method as those of the first embodiment except that the solder pieces 7 of the mounting pad 5 are not provided. Therefore, the description relating to the same structure is omitted here by adding the same reference numerals to the corresponding elements for the sake of simplification of description.

As shown in FIG. 11, since the solder pieces 7 of the mounting pad 5 are not provided. The resulting bonding strength is less than that of the first embodiment. However, advantageously the process of forming the solder pieces 7 is not necessary and therefore the number of the necessary process steps is reduced.

THIRD EMBODIMENT

Figure 12:
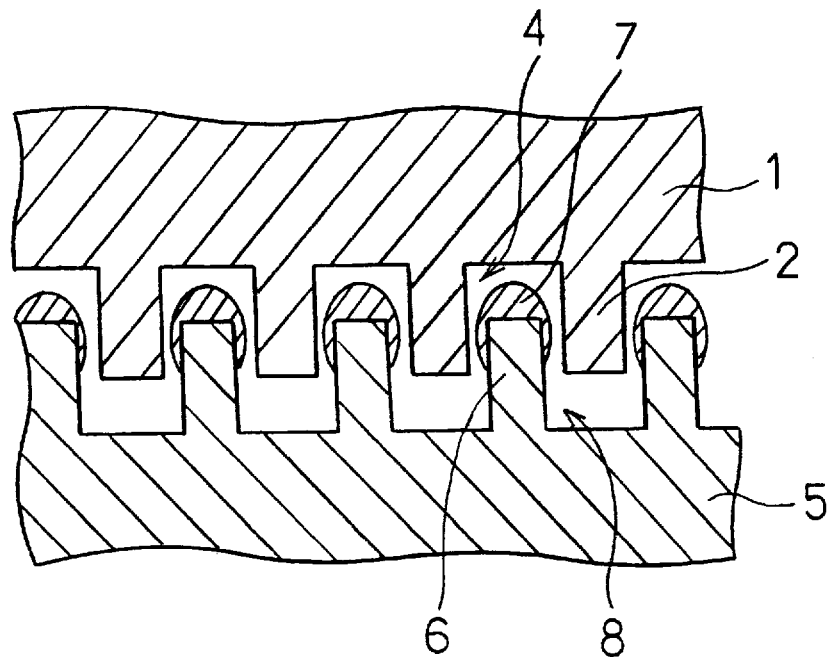
FIG. 12 is a schematic, partial cross-sectional view of a surface-mounting structure according to a third embodiment of the invention, in which the terminal and pad are on the way of the insertion process.
Figure 13:
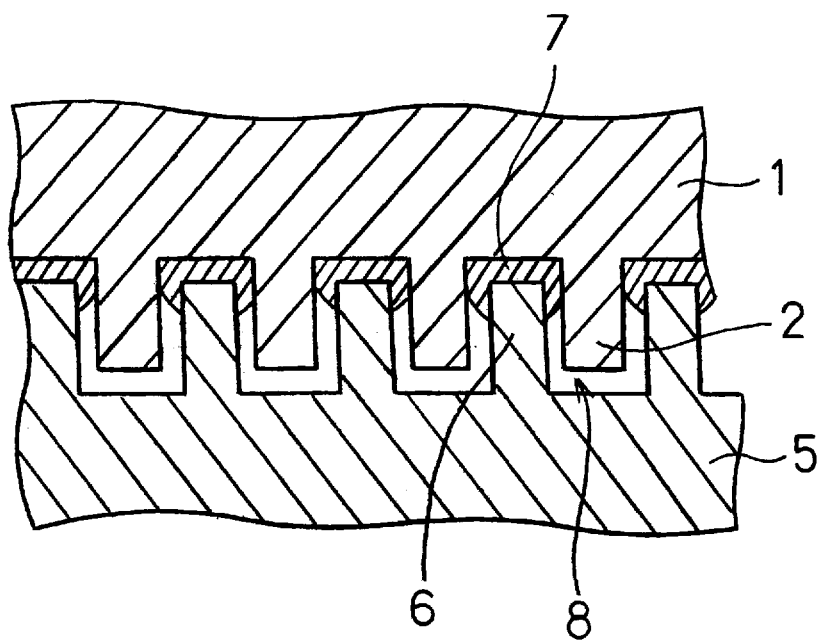
FIG. 13 is a schematic, partial cross-sectional view of a surface-mounting structure according to the third embodiment of the invention, in which the insertion process of the terminal and pad is finished.

FIGS. 12 and 13 show a surface-mounting structure of an electronic device according to a third embodiment of the invention.

The third embodiment has the same structure and method as those of the first embodiment except that the solder pieces 3 of the terminal 1 are not provided. Therefore, the description relating to the same structure is omitted here by adding the same reference numerals to the corresponding elements for the sake of simplification of description.

As shown in FIG. 13, since the solder pieces 3 of the terminal 1 are not provided, the resulting bonding strength is less than in the first embodiment. However, as with the second embodiment, the number of necessary process steps is reduced.

FOURTH EMBODIMENT

Figure 14:
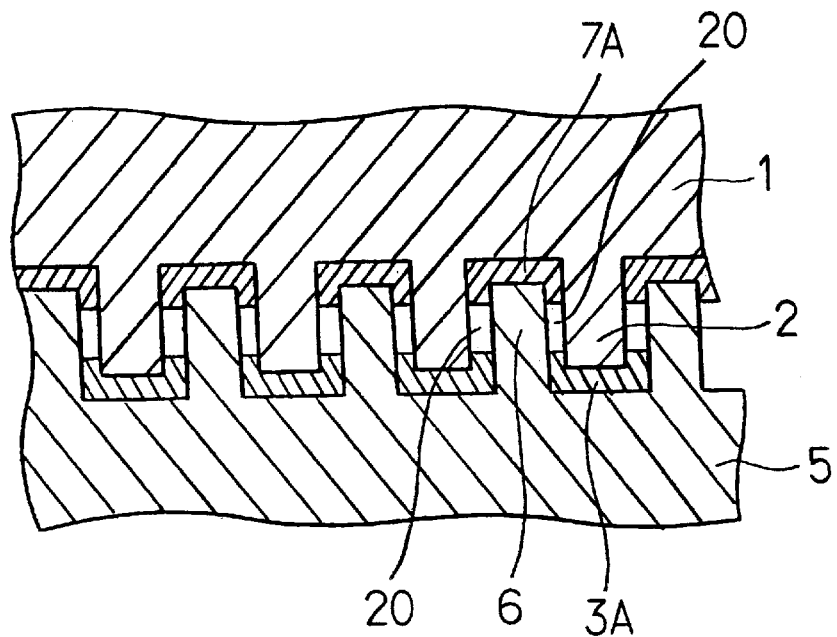
FIG. 14 is a schematic, partial cross-sectional view of a surface-mounting structure according to a fourth embodiment of the invention, in which the bonding material is resolidified.

FIG. 14 shows a surface-mounting structure of an electronic device according to a fourth embodiment of the invention.

The fourth embodiment has the same structure as that of the first embodiment except that resolidified solder pieces 3A and 7A are provided.

In this case, the solder pieces 3A and 7A themselves are bonded to the opposing mounting surfaces. Advantageously, the mechanical and electrical bonding strengths between the terminals 1 and pads 5 are enhanced compared with the first embodiment.

The resolidified solder pieces 3A and 7A are formed by an additional process of heating the solder pieces 3 and 7 during a specific time, thereby temporarily melting the pieces 3 and 7.

FIFTH EMBODIMENT

Figure 15:
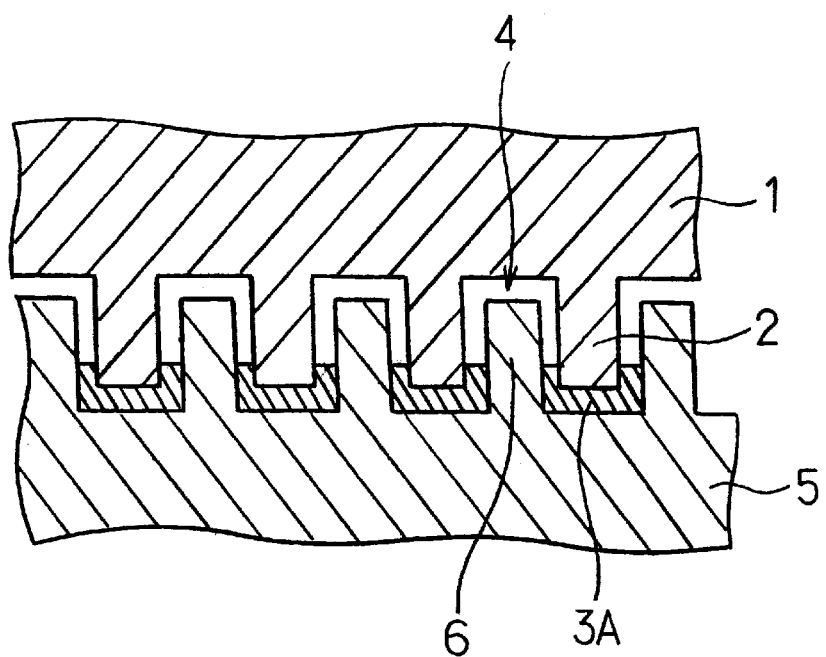
FIG. 15 is a schematic, partial cross-sectional view of a surface-mounting structure according to a fifth embodiment of the invention, in which the bonding material is resolidified.

FIG. 15 shows a surface-mounting structure of an electronic device according to a fifth embodiment of the invention.

The fifth embodiment has the same structure as that of the second embodiment except that resolidified solder pieces 3A are provided.

In this case, the solder pieces 3A themselves are bonded to the opposing mounting surfaces and accordingly, the mechanical and electrical bonding strengths between the terminals 1 and pads 5 are enhanced arises compared with the second embodiment.

SIXTH EMBODIMENT

Figure 16:
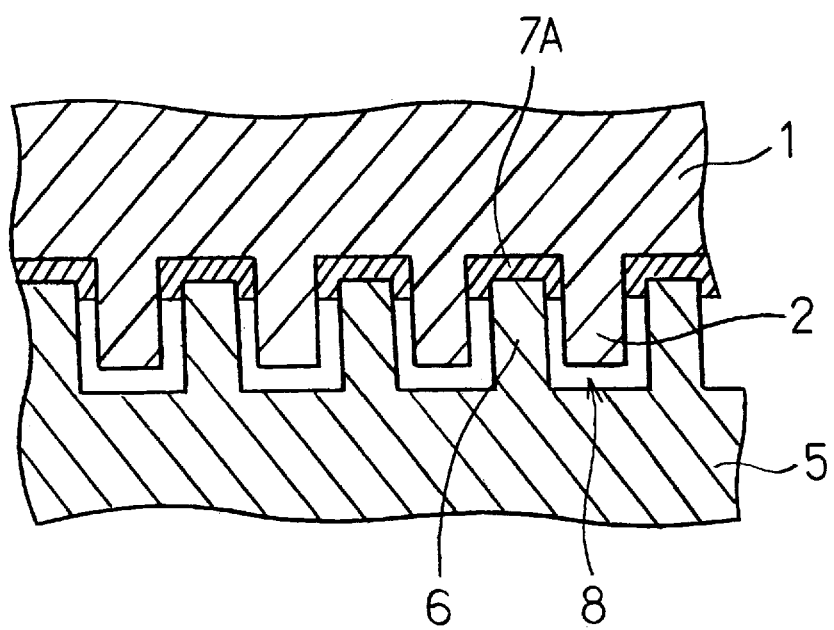
FIG. 16 is a schematic, partial cross-sectional view of a surface-mounting structure according to a sixth embodiment of the invention, in which the bonding material is resolidified.

FIG. 16 shows a surface-mounting structure of an electronic device according to a sixth embodiment of the invention.

The sixth embodiment has the same structure as that of the third embodiment except that resolidified solder pieces 7A are provided.

In this case, the solder pieces 7A themselves are bonded to the opposing mounting surfaces and accordingly, the mechanical and electrical bonding strengths between the terminals 1 and pads 5 are enhanced compared with the third embodiment.

Although the dot-shaped (or cylindrical) protrusions 2 and stripe-shaped protrusions 6 are formed in the first to sixth embodiments, it is needless to say that any other shape may be used for the protrusions 2 and 6 in the invention. For example, the protrusions 2 and 6 may have such a shape as a lattice, a vortex, a rod, a combination of multiple concentric squares or circles, or waves.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A surface-mounting structure for mounting an electronic device onto a circuit medium, said structure comprising;

an electronic device having an external terminal;

said external terminal having a first mounting surface with a first set of protrusions;

said first mounting surface including a first uncovered space in the remaining area of said first set of protrusions;

a circuit medium having a mounting pad on its surface;

said mounting pad having a second mounting surface on which a second set of protrusions are formed;

said second mounting surface including a second uncovered space in the remaining area of said second set of protrusions;

said second mounting surface being opposite to said first mounting surface;

said second set of protrusions being inserted into said first uncovered space;

said first set of protrusions being inserted into said second uncovered space; and a bonding material placed between said first mounting surface and said second mounting surface, said bonding material providing a mechanical engagement between said first mounting surface and said second mounting surface, thereby mechanically and electrically connecting said terminal of said device onto said mounting pad of said circuit medium, said bonding material is placed between the tops of said first set of protrusions and the opposing bottom of said second uncovered space, and said bonding material is fixed to the tops of said first set of protrusions.

2. A surface-mounting structure as claimed in claim 1, wherein said bonding material is placed between the tops of said first set of protrusions and the opposing bottom of said second uncovered space and between the tops of said second set of protrusions and the opposing bottom of said first uncovered space.

3. A surface-mounting structure as claimed in claim 2, wherein said bonding material is fixed to the tops of said first set of protrusions and the tops of said second set of protrusions.

4. A surface-mounting structure as claimed in claim 2, wherein said bonding material is fixed to the tops of said first set of protrusions, the bottom of said first uncovered space, the tops of said second set of protrusions, and the bottom of said second uncovered space.

5. A surface-mounting structure as claimed in claim 1, wherein said bonding material is fixed to the bottom of said second uncovered space.

6. A surface-mounting structure for mounting an electronic device onto a circuit medium, said structure comprising;

an electronic device having an external terminal;

said external terminal having a first mounting surface with a first set of protrusions;

said first mounting surface including a first uncovered space in the remaining area of said first set of protrusions;

a circuit medium having a mounting pad on its surface;

said mounting pad having a second mounting surface on which a second set of protrusions are formed;

said second mounting surface including a second uncovered space in the remaining area of said second set of protrusions;

said second mounting surface being opposite to said first mounting surface;

said second set of protrusions being inserted into said first uncovered space;

said first set of protrusions being inserted into said second uncovered space; and a conductive bonding material placed between said first mounting surface and said second mounting surface, said bonding material providing a mechanical engagement between said first mounting surface and said second mounting surface, thereby mechanically and electrically connecting said terminal of said device onto said mounting pad of said circuit medium, said bonding material is placed between the tops of said second set of protrusions and the opposing bottom of said first uncovered space.

7. A surface-mounting structure as claimed in claim 6, wherein said bonding material is fixed to the tops of said second set of protrusions.

8. A surface-mounting structure as claimed in claim 6, wherein said bonding material is fixed to the tops of said second set of protrusions and the bottom of said first uncovered space.

9. A surface-mounting structure as claimed in claim 6, wherein said bonding material is in a resolidified state;

wherein said bonding material is made of a metal having a melting point of 450° C. or less;

and wherein said bonding material is bonded to the tops of said second set of protrusions and the opposing bottom of said first uncovered space.

10. A surface-mounting structure for mounting an electronic device onto a circuit medium, said structure comprising;

an electronic device having an external terminal;

said external terminal having a first mounting surface with a first set of protrusions;

said first mounting surface including a first uncovered space in the remaining area of said first set of protrusions;

a circuit medium having a mounting pad on its surface;

said mounting pad having a second mounting surface on which a second set of protrusions are formed;

said second mounting surface including a second uncovered space in the remaining area of said second set of protrusions;

said second mounting surface being opposite to said first mounting surface;

said second set of protrusions being inserted into said first uncovered space;

said first set of protrusions being inserted into said second uncovered space;

a bonding material placed between said first mounting surface and said second mounting surface, said bonding material providing a mechanical engagement between said first mounting surface and said second mounting surface, thereby mechanically and electrically connecting said terminal of said device onto said mounting pad of said circuit medium, said bonding material is made of a metal having a melting point of 450° C. or less, said bonding material is in a resolidified state, bonded to the tops of said first set of protrusions and to the tops of said second set of protrusions and said bonding material is bonded to the tops of said first set of protrusions and the opposing bottom of said second uncovered space.

11. A surface-mounting structure as claimed in claim 10, wherein said bonding material is bonded to the tops of said second set of protrusions and the opposing bottom of said first uncovered space.

* * * * *